(12) United States Patent
Van Aelst et al.

(10) Patent No.: US 7,807,583 B2
(45) Date of Patent: Oct. 5, 2010

(54) HIGH ASPECT RATIO VIA ETCH

(75) Inventors: Joke Van Aelst, Heusden-Zolder (BE); Herbert Struyf, Kontich (BE); Serge Vanhaelemeersch, Leuven (BE)

(73) Assignee: IMEC, Leuven (BE)

( * ) Notice: Subject to any disclaimer, the term of this patent is extended or adjusted under 35 U.S.C. 154(b) by 673 days.

(21) Appl. No.: 11/782,496

(22) Filed: Jul. 24, 2007

(65) Prior Publication Data
US 2008/0050919 A1   Feb. 28, 2008

Related U.S. Application Data

(60) Provisional application No. 60/840,222, filed on Aug. 25, 2006.

(30) Foreign Application Priority Data

Apr. 17, 2007   (EP) .................... 07106361

(51) Int. Cl.
H01L 21/302   (2006.01)
(52) U.S. Cl. .................. 438/717; 438/706; 438/719; 430/314
(58) Field of Classification Search ........... 438/700, 438/706, 710, 712, 714, 720, 424, 717, 719; 430/314, 322
See application file for complete search history.

(56) References Cited

U.S. PATENT DOCUMENTS

| | | | |
|---|---|---|---|
| 6,426,300 B2 * | 7/2002 | Park et al. ............. 438/700 |
| 2002/0148807 A1 * | 10/2002 | Zhao et al. ............. 216/2 |
| 2004/0259325 A1 * | 12/2004 | Gan ..................... 438/456 |
| 2005/0001326 A1 | 1/2005 | Masuda |
| 2005/0085047 A1 * | 4/2005 | DeLoach et al. ......... 438/424 |
| 2005/0274691 A1 | 12/2005 | Park |
| 2006/0273465 A1 * | 12/2006 | Tamura ................. 257/774 |

FOREIGN PATENT DOCUMENTS

| | | |
|---|---|---|
| EP | 0149330 A1 | 7/1985 |
| JP | 2003 031520 | 1/2003 |
| JP | 2004 207319 | 7/2004 |
| WO | WO 2006 086337 A1 | 8/2006 |

* cited by examiner

*Primary Examiner*—Lan Vinh
(74) *Attorney, Agent, or Firm*—Knobbe Martens Olson & Bear LLP

(57) ABSTRACT

A method for patterning high aspect ratio vias is provided. More specifically a dry etching method is provided for patterning deep vias or vias with high aspects ratios thereby eliminating the hard mask undercut. A method is provided to create (pattern) deep vias in a substrate for use in three dimensional stacked semiconductor devices and/or structures. More specifically, a method is provided for patterning deep vias with an aspect ratio up to 10 into a Si substrate with smooth via sidewalls and sufficient slope to enable metallization.

43 Claims, 9 Drawing Sheets

HIGH ASPECT RATIO VIA ETCH

CROSS-REFERENCE TO RELATED APPLICATIONS

This application claims the benefit under 35 U.S.C. §119(e) of U.S. provisional application Ser. No. 60/840,222 filed Aug. 25, 2006, and claims the benefit under 35 U.S.C. §119(a)-(d) of European application No. EP 07106361.4 filed Apr. 17, 2007, the disclosures of which are hereby expressly incorporated by reference in their entireties and are hereby expressly made a portion of this application.

FIELD OF INVENTION

A method of etching high aspect ratio vias is provided, more specifically vias with aspect ratio up to 10:1. The method eliminates undercut during etching high aspect ratios. Creation of copper nails for 3 dimensional stacking of wafer to connect stacked interconnect structures is provided, as well as methods for coupling of stacked semiconductor structures or components for Micro-Electro-Mechanical Systems (MEMS).

BACKGROUND OF THE INVENTION

Since traditional two dimensional (2D) planar architecture of interconnects in semiconductor devices inevitably imposes restrictions on miniaturization, new interconnection and packaging technologies need to be developed to keep on track with the continuously scaling of electronic systems. Three dimensional (3D) integration is an interesting solution since it allows for reduction of the system size, both in area and volume. Furthermore, it improves performance since 3D interconnects are shorter than in a 2D configuration, enabling a higher operation speed and smaller power consumption. A third advantage is the possibility of hetero-integration, the "seamless" mixing of different microelectronic technologies at wafer level. Different technology solutions are available for creating 3D interconnects. The highest interconnect density can be obtained with the 3D-stacked IC approach (3D-SIC). In this concept a deep via is etched through the Pre Metal Dielectric (PMD) into the Si after the front end of line (FEOL) processing. Only after metalizing the vias the back end of line (BEOL) processing is done. This puts minimal impact on CMOS wafer design because of the small exclusion area on the FEOL, the absence of impact on the BEOL wiring and the small number of necessary additional process steps.

Another promising application of using deep vias in stacked semiconductor structures is the coupling of stacked semiconductor structures or components for Micro-Electro-Mechanical Systems (MEMS) with each other by means of deep vias filled with conductive material.

The applications mentioned above require the etching of high-aspect ratio deep vias in a patterned thick semiconductor structure or a substrate and fill it with a conductive material. To ensure a reliable electrical connection between stacked semiconductor wafers or between elements of the devices in MEMS applications, a passivation layer, a barrier layer, and a seed conductive layer, such as a copper layer for electroplating needs to be deposited onto the sidewalls of the deep via. Said passivation and/or barrier layer must be smooth and uniform to allow the conductive material to uniformly fill the opening.

However, etching of said deep vias in the silicon substrate is not straightforward since standard etching procedures known in prior art for etching openings (vias) in a semiconductor substrate result in substantial undercut of the hardmask which is detrimental for the deposition of a conformal TaN barrier layer afterwards. The deep vias for connecting stacked 3D interconnects typically have an aspect ratio up to 10:1 which makes it impossible to use standard etching procedures.

One method available in the prior art to avoid the hardmask undercut is using a polymerizing etch process. During this process, a polymer layer is deposited on the sidewalls of the etched silicon substrate to block the lateral component of etching, resulting in a reduction of a hard mask undercut. However, this method employs ions with high energy, which may cause damage to a semiconductor structure due to an excessive ion bombardment. Further, the residuals of the polymer layer left on the sidewalls of the etched structure may cause a problem for a subsequent wet cleaning process. More specifically, the residuals of the polymer layer left on the sidewalls may impact the device's performance leading to a device reliability problem.

Another method that attempts to overcome the barrier layer non-uniformity caused by the oxide hardmask undercut uses the atomic layer deposition (ALD) process to deposit a uniform barrier layer. Since, during the ALD process, a material is deposited sequentially one atomic layer after another, this method is very time-consuming and expensive.

In US2005/0274691 a portion of the opening in the silicon substrate is etched generating a hard mask undercut. Then, the hard mask layer is trim-etched to remove the hard mask undercut. Next, the portion of the opening in the substrate is etched for a second time, generating a hard mask undercut for a second time. Trim-etching the hard mask followed by etching the portion of the opening in the substrate is continuously repeated until a predetermined depth of the opening in the substrate is achieved. This method is rather complicated and rather difficult to obtain smooth sidewalls and to have control on the CD of the via.

Thus, the prior art proposes several solutions for eliminating undercut but all of them do have serious drawbacks and shortcomings. The prior art does never provide a solution that eliminates the undercut in the silicon substrate without substantially altering the standard etch plasma and process used to etch a silicon substrate.

SUMMARY OF THE INVENTION

A method is provided to create (pattern) deep vias in a substrate for use in three dimensional stacked semiconductor devices and/or structures.

More specifically a method is provided to pattern deep vias with an aspect ratio up to 10 and even more into a (Si) substrate with smooth via sidewalls and sufficient slope and thereby avoiding hardmask undercut to enable metallization of the deep via.

The preferred embodiments relate to the patterning of deep vias in a substrate, said deep vias preferably having aspect ratios of more than 5, preferably of more than 10 (or in other words having a height to width ratio of more than 5:1, preferably of more than 10:1).

A method for etching a deep via in a substrate is disclosed, this method at least comprising the steps of:
  providing a substrate with at least one first layer on top of said substrate,
  depositing at least one first lithographic imaging layer on top of said first layer(s),
  forming a first pattern having a first diameter into said first lithographic imaging layer(s),
  transferring said first pattern into said first layer(s), removing said first lithographic imaging material(s), depositing at least one second lithographic imaging layer(s) on top of said patterned first layer(s), forming, into said second lithographic imaging layer(s) and coinciding with said first pattern, a second pattern having a second diameter, etching the deep via in said substrate using the second pattern as hard mask, removing said second lithographic imaging layer(s).

According to embodiments of the disclosed method, the first diameter is equal to the final aimed diameter of the deep via and said second diameter is smaller than said first diameter.

According to embodiments of the disclosed method the first diameter is equal to the final aimed diameter of the deep via and said second diameter is smaller than said first diameter and said second lithographic imaging layer(s) is/are replaced by a uniform polymer layer deposited on top of said patterned first layer(s) for reducing the diameter of said first pattern. The method according to this embodiment further comprises the steps of:

etching the deep via in said substrate (1) using the first pattern with said polymer layer on top as hard mask, removing said first lithographic imaging layer(s) and said polymer layer.

According to embodiments of the disclosed method the first and second diameter are equal to each other and smaller than the final aimed diameter of the deep via. The method according to this embodiment further comprises after the step of forming a first pattern the steps of:

expanding said first pattern in said first lithographic imaging layer(s) by resist trimming for creating a trimmed pattern, transferring said trimmed pattern into said first layer(s), According to the first preferred embodiment, a method is provided for etching a deep via in a substrate starts with the steps of first providing a substrate with a first layer, preferably a permanent first layer, on top of said substrate.

On top of said first layer, at least one first lithographic imaging layer is deposited and a first pattern with final aimed diameter of the deep via is formed into said first lithographic imaging layer(s).

The first pattern is then transferred using standard lithographic patterning and dry etching techniques into said first layer (resulting in an opening into said first layer).

After removing said first lithographic imaging material(s) (or layer(s)), at least one second lithographic imaging layer is deposited on top of said patterned first layer and a second pattern, having a diameter which is smaller than the diameter of the first pattern, is formed into said second lithographic imaging layer(s), aiming at reducing the diameter of the first opening.

Most preferred said second pattern is having a diameter of minimum 10% up to 20% smaller in dimension than the final aimed diameter.

The deep via is then etched in said substrate using the second pattern as hard mask.

After removing said second lithographic imaging layer(s) a deep via without undercut is obtained.

According to an alternative of said first embodiment, a method is provided for etching a deep via in a substrate can comprise the following steps. Providing a substrate with a first layer, preferably a permanent first layer, on top of said substrate.

Onto said (permanent) first layer, at least one first lithographic imaging layer is deposited.

A first pattern with final aimed diameter of the deep via is formed into said first lithographic imaging layer(s) and said first pattern is transferred into said first layer (resulting in an opening into said first layer).

A uniform polymer type layer is then deposited on top of said patterned first layer such that the diameter of the first pattern becomes smaller (preferably 10% up to 20%) than the final aimed diameter.

Preferably said polymer type layer is a plasma generated (deposited in a plasma chamber) polymer layer such as a $C_xH_yF_z$ (hydrofluorocarbon) comprising polymer.

The deep via is then etched into said substrate using the first pattern with said polymer layer on top as hard mask.

After removal of the first lithographic imaging layer(s) and polymer layer, a deep via without undercut is obtained.

According to a second preferred embodiment, a method is provided for etching a deep via in a substrate, starts with the step of providing a substrate with a first layer, preferably a permanent first layer, on top of said substrate.

Onto said first layer at least one first lithographic imaging layer is deposited and a first pattern is formed in said first lithographic imaging layer(s) with a target dimension, said target dimension being smaller than the final aimed diameter of the deep via, into said first lithographic imaging layer(s).

Most preferred said first pattern is having a diameter of minimum 10% up to 20% smaller in dimension than the final aimed diameter.

The first pattern is then expanded by resist trimming, creating a trimmed pattern.

The trimmed pattern is then transferred using standard lithographic patterning and dry etching techniques into said first layer (resulting in an opening into said first layer).

After removal of said first lithographic imaging material(s) (or layer(s)), at least one second lithographic imaging layer is deposited on top of said patterned first layer and a second pattern, having a diameter which is equal to the first pattern, is formed into said second lithographic imaging layer(s). The opening is reduced thereby.

The deep via is then etched in said substrate using the second pattern as hard mask.

After removing said second lithographic imaging layer(s) a deep via without undercut is obtained.

According to a third preferred embodiment, a method is provided for etching a deep via in a substrate starts with the step of providing a substrate with a first layer, preferably a permanent first layer, on top of said substrate.

At least one lithographic imaging layer (or resist) is deposited on top of said first layer and a resist pattern is formed in said lithographic imaging layer(s) with a target dimension being smaller than the final aimed diameter of the deep via, into said lithographic imaging layer(s).

Most preferred said resist pattern is having a diameter of minimum 10% up to 20% smaller in dimension than the final aimed diameter.

The resist pattern is then transferred into said first layer (providing an opening into said first layer) and the deep via is etched in said substrate using the resist pattern as hard mask creating an undercut under the first layer.

Subsequently the resist is trimmed (for removing overhanging resist) to the final aimed diameter of the deep via and the overhanging part of the first layer is isotropically removed to the final aimed diameter of the deep via.

The deep vias mentioned in the preferred embodiments herein are high aspect ratio vias having a width in the range of 1 µm up to 10 µm and a depth into the substrate in the range of 10 µm up to 100 µm.

More preferred, said deep vias are high aspect ratio vias having width of 5 μm and a depth of 50 μm.

The final aimed diameter of the deep via as described in the preferred methods above corresponds to the final aimed width of the vias, hence said final aimed (target) diameter is preferably in the range of 1 μm up to 10 μm, more preferred around 5 μm.

Said high aspect ratio vias are preferably used for stacking semiconductor wafers, e.g. for three dimensional stacking of interconnect structures or stacking elements of devices in MEMS applications.

The substrate used can be a silicon substrate, or a silicon comprising substrate. Preferably, said substrate is a silicon substrate (Si-wafer).

A method of the preferred embodiments can also apply to a germanium (Ge) wafer, or a Ge comprising wafer.

Said first layer situated on top of said substrate can be a sacrificial layer (which is to be removed in a subsequent step), and/or a protective layer.

Said first layer situated on top of said substrate is preferably a permanent layer (also referred to as a permanent first layer).

The permanent first layer mentioned in the preferred methods above situated on top of said substrate is preferably a Pre Metal Dielectric (PMD) layer, more preferred said PMD layer is $SiO_2$.

Alternatively said PMD layer can be made of a low-k material (i.e. material with a dielectric constant, k, lower than the dielectric constant of $SiO_2$) as conventionally used in semiconductor processing.

The lithographic imaging layer(s) mentioned in the preferred embodiments herein is/are preferably (a) resist layer(s) with optionally an anti-reflective coating. The removal (strip) of resist is preferably performed in a $O_2/N_2$ comprising plasma followed by a wet clean.

When a resist trim is performed in the preferred embodiments herein, this is preferably done in an $O_2$ comprising plasma with optional additions of $Cl_2$ and/or HBr.

The method used for etching the deep via in the Si substrate is performed in a passivation polymer type etch process using fluor comprising plasma, more particularly a $C_4F_8/SF_6$ comprising plasma, alternating a deposition followed by an etch step whereby said alternating deposition/etch steps are continuously repeated.

The deposition step is preferably performed using a $C_4F_8$ comprising plasma having more than 95% $C_4F_8$. The etch step is preferably performed using a $SF_6$ comprising plasma having more than 95% $SF_6$.

Furthermore the preferred embodiments relate to the use of a method according to the preferred embodiments described herein for etching a via with a high aspect ratios (preferably around 10) in a substrate.

Furthermore the preferred embodiments relate to a semiconductor device obtainable by the methods described herein to avoid undercut in a deep via.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

DETAILED DESCRIPTION OF THE PREFERRED EMBODIMENT

Figure 1:
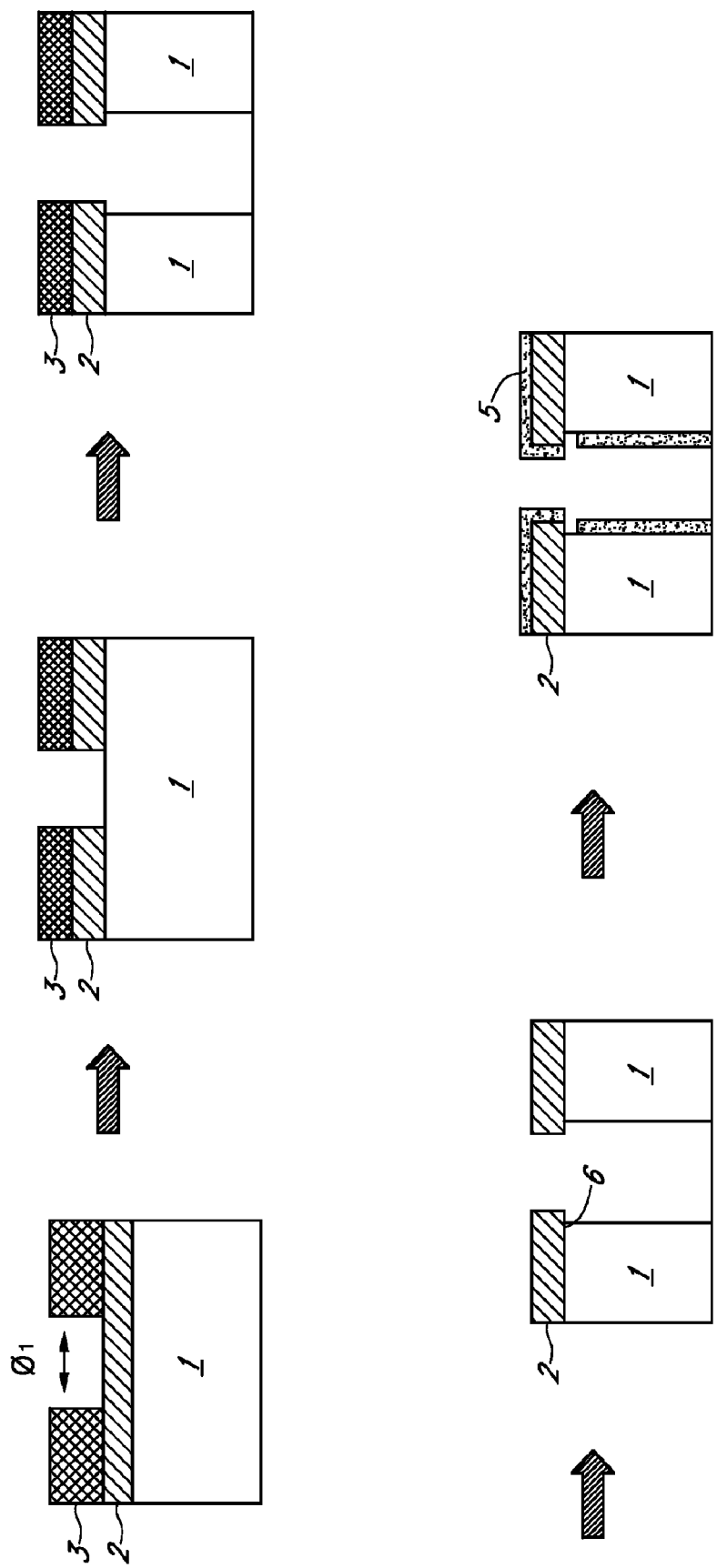
FIG. 1 (PRIOR ART) illustrates the problem of hard mask undercut and subsequent non-conformal deposition of a barrier layer using a standard etching procedure for etching the deep via into the substrate.

The following description illustrates methods to eliminate hardmask undercut during etching of deep vias into a substrate. It will be appreciated that there are numerous variations and modifications possible.

The drawings described are only schematic and are non-limiting. In the drawings, the size of some of the elements may be exaggerated and not drawn on scale for illustrative purposes. The dimensions and the relative dimensions do not correspond to actual reductions to practice of the invention.

In the context of the preferred embodiments, the term "etch undercut" or "hardmask undercut" refers to a beveled edge underneath the hardmask caused by the etchant attacking the sidewalls, due to the fact that the etch is not completely directional (vertical), and hence a small but not negligible lateral etch occurs.

In the context of the preferred embodiments, the term "aspect ratio" refers to the ratio of the height dimension to the width dimension of particular openings into which an electrical contact is to be placed. For example, a via opening which typically extends in a tubular form through a substrate (or multiple layers) has a height and a diameter, and the aspect ratio would be the height of the tubular divided by the diameter.

"Micro-electromechanical systems" or "MEMS" as used in the context of the preferred embodiments refers to any integrated device containing electrical and mechanical systems such as, but not restricted to, cantilevers, airbridges, and membranes which undergo mechanical stress or strain during their operation.

The preferred embodiments provide a method for eliminating hardmask undercut during dry etching of an opening in a substrate.

More specifically a method is provided for etching vias with high aspect ratios in a substrate, also referred to as deep vias, thereby eliminating hardmask undercut into the substrate.

Said deep vias are typically used as 3-dimensional copper interconnects in stacked semiconductor devices, also referred to as copper nails.

Furthermore said deep vias can be used to stack semiconductor structures or components for Micro-Electro-Mechanical Systems (MEMS) with each other.

Said deep vias typically have a depth in the range of 10 μm to 100 μm.

More specifically said deep vias have an aspect ratio of 10:1, for example for use as copper nails in 3D stacked semiconductor devices. And more particularly, said deep vias have a preferred depth into the substrate of approximately 50 μm and a diameter of approximately 5 μm.

The preferred embodiments solve the problem of hard-mask undercut 6 during etching of deep vias in a substrate 1 leading to a larger via diameter, a non-conformal deposition of the barrier layer 5 and voids 8 in the (copper) filling 7 as illustrated in FIG. 1.

By avoiding said undercut 6 it is possible to deposit a conformal layer onto the sidewalls of said deep via after patterning.

For the creation of deep vias filled with conductive material (e.g. copper nails) said conformal layer is at least one barrier layer to avoid diffusion of conductive material into the substrate (dielectric material).

Further layers can be added to improve filling of the deep via with conductive material such as a seed layer needed to perform electrochemical plating.

According to preferred embodiments a dry etch method is provided to etch deep vias into a substrate, preferably into a silicon substrate using a silicon dioxide layer as hard mask.

The preferred embodiments provide a method for etching, in a substrate (1), a deep via with a height to width ratio higher than 5:1, preferably of about 10:1 (or even higher), comprising the steps of:

providing a substrate (1) with at least one protective layer (2), preferably a PMD layer (2), on top of said substrate (1), providing an opening through said protective layer(s) (2) by photolithographic and etching steps, said opening having a diameter ($\varnothing_{opening}$) equal to or smaller than the final aimed diameter ($\varnothing_1$) of said deep via, depositing at least one lithographic imaging layer (3, 4) on top of said protective layer(s) (2), forming, into said lithographic imaging layer(s) (3, 4), a pattern having a diameter ($\varnothing_{pattern}$) smaller than the final aimed diameter ($\varnothing_1$) of said deep via, etching the deep via in said substrate (1) using said pattern as hard mask, removing said lithographic imaging layer(s) (3, 4), and removing, if any, the overhanging part of said protective layer(s) (2).

When said protective layer(s) (2) is/are meant to remain in the final structure, it is referred to herein as permanent layer(s) (2).

Said protective layer(s) (2) can also be one or more sacrificial layers (i.e. meant to be removed in a subsequent step).

Several additional embodiments can be derived from the preferred embodiments.

Figure 2:
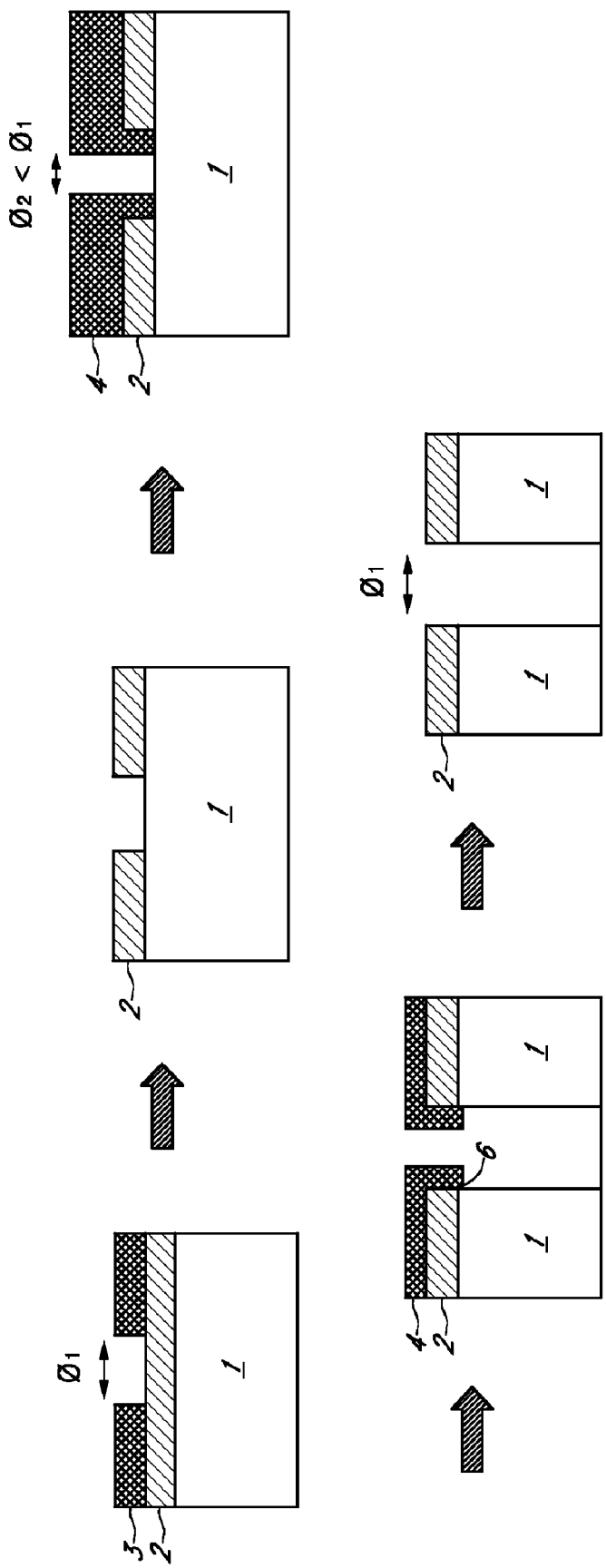
FIG. 2 illustrates the method for etching a deep via into a substrate avoiding hard mask undercut according to the first embodiment.
Figure 3:
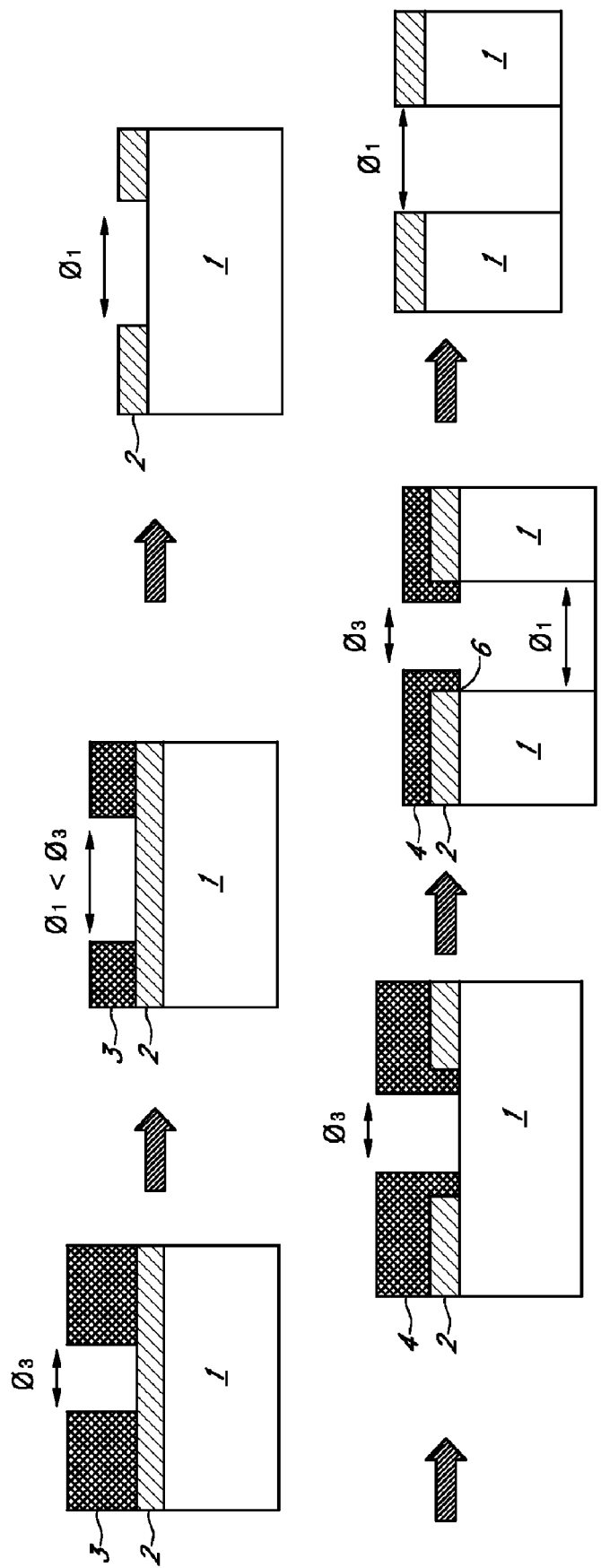
FIG. 3 illustrates the method for etching a deep via into a substrate avoiding hard mask undercut according to the second embodiment.

In a first or second preferred embodiment (as represented by FIG. 2 or 3), said opening is made with a diameter equal to the final aimed diameter of the deep via ($\varnothing_{opening}=\varnothing_1$).

The lithographic and etching steps for creating said opening involve at least one first lithographic imaging layer (3).

After the lithographic and etching steps for creating said opening, at least one second lithographic imaging layer (4) is deposited for forming a pattern, coinciding with said opening, said pattern having a diameter ($\varnothing_{pattern}=\varnothing_2$) smaller than the final aimed diameter of the deep via ($\varnothing_2<\varnothing_1$).

Preferably, said pattern has a diameter about 10% to about 20% smaller than the final aimed diameter of the deep via ($0{,}8.\varnothing_1 \leq \varnothing_{pattern} \leq 0{,}9.\varnothing_1$).

In the first preferred embodiment, two mask sets are necessary: the first defining a pattern with a diameter equal to the final aimed diameter of the deep via ($\varnothing_{pattern}=\varnothing_1$), and the second defining a pattern smaller than the final aimed diameter of the deep via ($\varnothing_{pattern}<\varnothing_1$).

Having regard to the first preferred embodiment, one possible alternative is the use, after the lithographic and etching steps for creating said opening, of a polymer layer, in particular a uniform polymer layer, which is deposited such that said opening diameter is reduced. Preferably, the reduction is about 10% to 20%.

In the second preferred embodiment, only one mask set is used, defining a pattern smaller than the final aimed diameter of the deep via ($\varnothing_{pattern}<\varnothing_1$). But before transferring this pattern into the protective layer(s) (2) for providing said opening, said pattern is expanded (preferably by trimming) such that its diameter reaches the final aimed diameter of the deep via ($\varnothing_{pattern}=\varnothing_1$).

At least one second lithographic imaging layer (4) is also further deposited for forming a pattern, coinciding with said opening, and using the same mask as previously used.

Said second lithographic imaging layer(s) (4) or said polymer layer is removed in a subsequent step.

Figure 4:
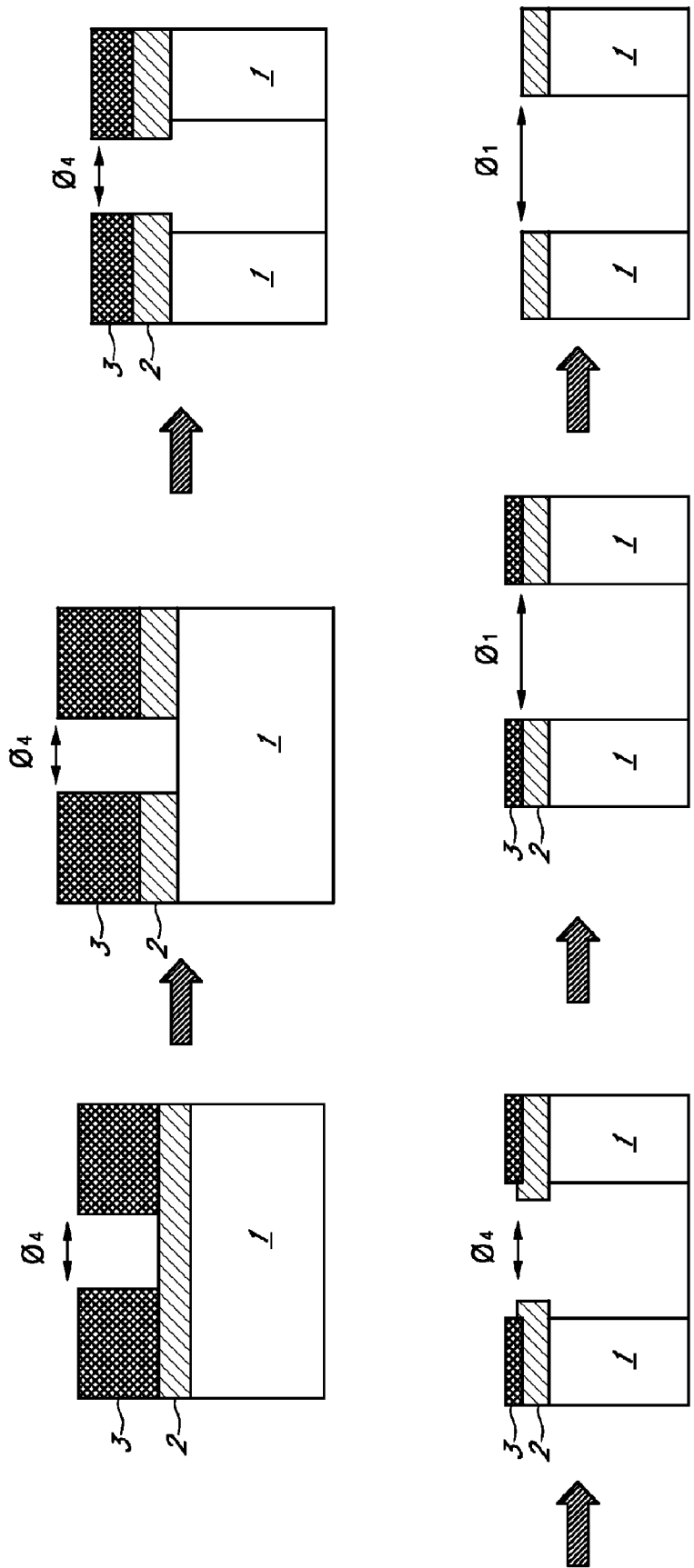
FIG. 4 illustrates the method for etching a deep via into a substrate avoiding hard mask undercut according to the third embodiment.

According to a third preferred embodiment (as represented by FIG. 4), said opening is made with a diameter smaller than the final aimed diameter of the deep via ($\varnothing_{opening}=\varnothing_1$).

The lithographic imaging layer(s) used for creating said opening, is/are used as hard mask in the subsequent step of etching the deep via.

Undercuts (6) are thus generated and can be removed by performing the following two subsequent steps: trimming said lithographic imaging layer(s) for expanding the diameter of the pattern to reach the final aimed diameter of the deep via, and then anisotropically etching the overhanging part of said protective layer(s) (2).

More specifically, and according to the first preferred embodiment, one additional lithographic step is applied to pattern the deep via.

More specifically, two lithographic steps with different target dimensions are used.

In the first lithographic step a mask having the final diameter of the deep via is used to create an opening in the layer(s) underneath the lithographic imaging layer(s).

After stripping the first lithographic imaging layer(s) (resist), a second lithographic step is applied using a mask with a target dimension smaller than the final aimed diameter of the deep via.

Most preferred said second target dimension (pattern) is having a diameter of 10% to 20% smaller in dimension than the final aimed target dimension (final diameter of the deep via).

As an example for the patterning of deep vias with a final aimed diameter of 5 μm, a first lithographic step with target dimension of 5 μm is performed followed by a second lithographic step with target dimension of 4 μm. Using this additional (second) lithographic step the substrate is etched, producing an undercut under the second lithographic imaging layer(s) (resist) which can be removed afterwards by stripping the resist.

Figure 5:
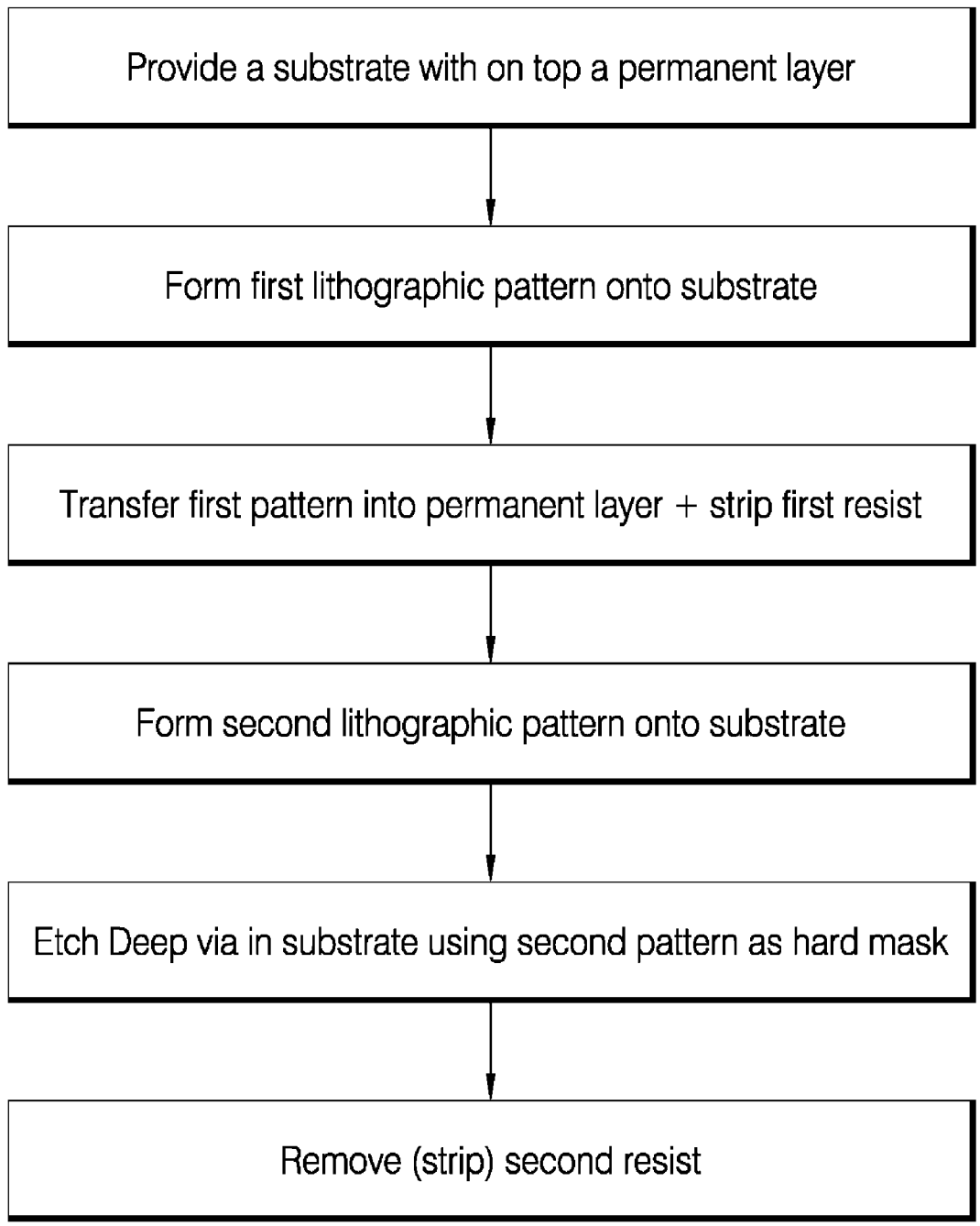
FIG. 5 shows a flow chart illustrating the main processing steps according to the first embodiment.

The preferred method for etching a deep via in a substrate according to the first embodiment is illustrated in FIG. 2 and shown schematically in a flow chart in FIG. 5.

The preferred method for etching a deep via in a substrate according to the first embodiment of the invention starts with the step of providing a substrate with a (permanent) first layer 2 on top of said substrate.

Said substrate 1 is preferably a semiconductor substrate, most preferred a silicon (Si) wafer or Si comprising wafer.

On top of said wafer is a first layer 2, preferably a permanent first layer 2.

For the patterning of deep vias for use in three dimensional stacking of wafers for connecting interconnect structures, said permanent first layer 2 is a Pre Metal Dielectric (PMD) layer. Most preferred said PMD layer is a $SiO_2$ layer.

At least one first lithographic imaging layer 3 is deposited on top of said permanent first layer 2.

A first pattern with final aimed diameter of the deep via (equal to $\varnothing_1$) is transferred into said first lithographic imaging layer(s) 2. The first pattern (with width $\varnothing_1$) is then transferred into the permanent first layer 2.

The first lithographic imaging layer(s) 3 is/are then removed (resist strip) and at least one second lithographic imaging layer 4 is deposited on top of said patterned permanent first layer 2. A second pattern is then transferred into the second lithographic imaging layer(s) with a pattern having a diameter which is smaller than the first pattern (said second pattern having a width equal to $\varnothing_2$) into said second lithographic imaging layer(s), thereby reducing the diameter of said first pattern, preferably of 10% to 20%.

A deep via is then etched into the substrate 1 using the second pattern (said second pattern having a width equal to $\varnothing_2$) as hard mask.

Preferably, the deep via etch is a passivation polymer type etch.

Said etch process is preferably using a fluor comprising plasma, preferably a $C_4F_8/SF_6$ comprising plasma, with alternating a deposition followed by an etch step whereby said alternating deposition/etch steps are continuously repeated.

Said deposition step is preferably performed using a $C_4F_8/SF_6$ comprising plasma having more than 90% $C_4F_8$, more preferred a plasma containing more than 95% $C_4F_8$ is used to perform the deposition step.

The etch step is performed using a $C_4F_8/SF_6$ comprising plasma having more than 90% $SF_6$, more preferred a plasma containing more than 95% $SF_6$ is used to perform the etch step.

Finally said second lithographic imaging layer(s) is/are removed (resist strip) with no undercut formed, resulting in a deep via with smooth sidewalls.

The removal of the second lithographic imaging layer(s) 4 is performed by a strip process. Said strip process can be performed using a $O_2/N_2$ plasma in a down stream asher followed by a conventional wet clean.

The method according to the first preferred embodiment can be used for the creation of deep vias filled with conductive material 7 such as copper (also referred to as "copper nails") for 3D stacking of interconnect structures (ICs) of semiconductor devices (also referred to as 3D-SIC or 3 dimensional stacked ICs) into the substrate.

Said substrate is then preferably a silicon wafer comprising active devices (referred to as FEOL) with a Pre Metal Dielectric (PMD) layer on top of said substrate acting as the first permanent layer. Said PMD layer is preferably $SiO_2$. The first pattern, being equal to the final aimed diameter of the copper nail, is preferably in the range of 5 μm. The second pattern has preferably a diameter of 4 μm.

According to the first preferred embodiment, the problem of hard mask undercut is thus solved and eliminated by means of using a second mask with a smaller opening such that after removal of said second mask no undercut is remaining.

As an alternative and also preferred option the second lithographic patterning used in the first preferred embodiment can be replaced by the conformal deposition of a polymer type layer onto the first pattern.

This alternative also allow to obtain a pattern with reduced diameter (smaller than the final aimed diameter $\varnothing_1$), said diameter is preferably having a width equal to $\varnothing_2$, avoiding thereby the use of a second lithographic patterning step.

Accordingly, a method of the preferred embodiments for etching a deep via in a substrate can comprise the steps of:
providing a substrate with a permanent first layer on top of said substrate,
depositing, onto said permanent first layer, at least one first lithographic imaging layer,
forming a first pattern, with the final aimed diameter of the deep via, into said first lithographic imaging layer(s), and transferring said first pattern into said permanent first layer,
depositing a uniform polymer type layer, on top of said patterned first layers, for reducing the diameter of said first pattern, preferably of 10% up to 20% (reduction of 10% to 20% compared to said final aimed diameter),
etching the deep via into said substrate using the first pattern with said polymer layer on top as hard mask, and
removing said first lithographic imaging layer(s) and said polymer layer, whereby a deep via without undercut is obtained.

Preferably said polymer type layer is a plasma generated (deposited in a plasma chamber) polymer layer such as a $C_xH_yF_z$ (hydrofluorocarbon) comprising polymer.

In the second and also preferred embodiment, also one additional lithographic step is applied to pattern the deep via.

In this alternative, two lithographic patterning steps are applied but only one mask set is needed in combination with an additional resist trim step.

The target dimension (opening) of the mask is smaller than the final aimed diameter of the deep via.

Most preferred said target dimension (pattern) is having a diameter of minimum 10% up to 20% smaller in dimension than the final aimed target dimension (final diameter of the deep via).

After the first lithographic step, the first photolithographic imaging layer(s) (resist) is/are trimmed such that an opening is created, equal to the final aimed diameter of the deep vias.

In other words, after the first lithographic step, the first photolithographic imaging layer(s) (resist) is/are trimmed for obtaining an opening into said first permanent layer 2 having a diameter bigger than the diameter defined by the mask.

This (trimmed) pattern is then transferred to the layer underneath the first photolithographic imaging layer(s) (resist) (i.e. into the first permanent layer 2) and the first photolithographic imaging layer(s) (resist) is/are stripped.

Next, at least one second lithographic imaging layer is deposited onto said first patterned permanent layer 2 and a second lithographic patterning step is applied, aiming at reducing the first pattern.

Using the second lithographic pattern as hard mask, the deep via is etched in the substrate, i.e. through the reduced opening.

An undercut underneath the second lithographic pattern is created but is removed during subsequent removal of the lithographic imaging layer(s) (strip) such that a deep via with smooth sidewalls is created.

Figure 6:
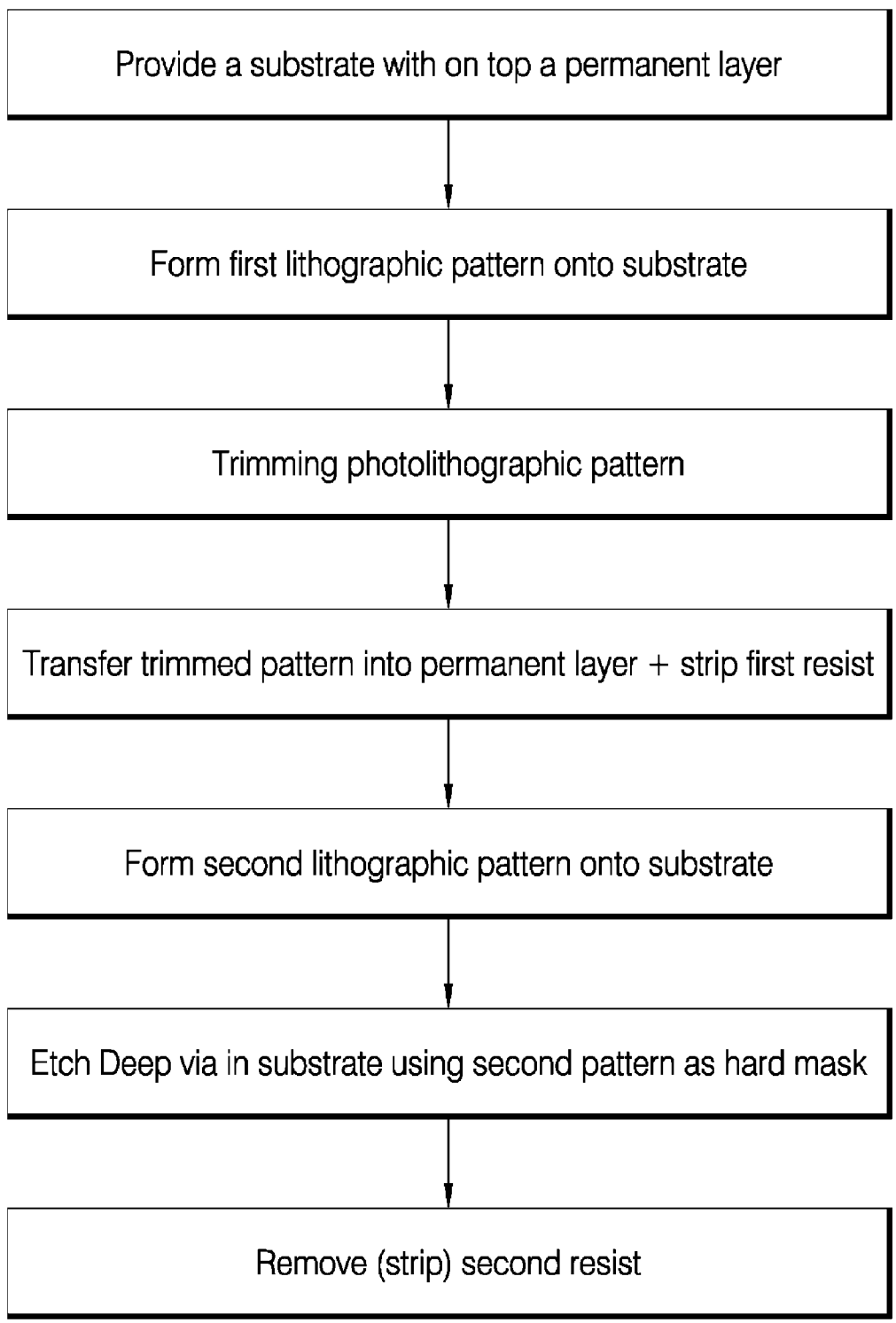
FIG. 6 shows a flow chart illustrating the main processing steps according to the second embodiment.

The preferred method for etching a deep via in a substrate according to the second embodiment is illustrated in FIG. 3 and shown schematically in a flow chart in FIG. 6.

The preferred method for etching a deep via in a substrate according to the second embodiment of the invention starts with the step of providing a substrate 1.

Said substrate 1 is preferably a semiconductor substrate, most preferred a Si wafer. e.g. a Si wafer.

On top of said wafer is a permanent layer 2.

For the patterning of deep vias for use in three dimensional stacking of wafers for connecting interconnect structures, said permanent layer 2 is a Pre Metal Dielectric (PMD) layer. Most preferred said PMD layer is a $SiO_2$ layer.

Onto said permanent layer 2 at least one first lithographic imaging layer 3, also referred to as resist, is deposited. Then a first pattern with diameter $ø_3$ is formed in said first lithographic imaging layer(s) 3 whereby the target dimension of said first pattern is smaller than the final aimed diameter of the deep via (equal to $ø_1$), i.e. $ø_3$ is smaller than $ø_1$.

The first lithographic pattern is then expanded using a resist trimming and thus forming a trimmed pattern with target dimension having a diameter equal to the final aimed diameter of the deep via (equal to $ø_1$). Said resist trimming is performed using an $ø_2$ plasma. Additionally $Cl_2$ and/or HBr can be added to the plasma to optimize the trimming recipe.

The trimmed pattern is then transferred into the first permanent layer 2 (or opening said first permanent layer 2) and the first lithographic imaging material(s) is then removed, whereby an opening with a diameter $ø_1$ is obtained (higher than $ø_3$).

At least one second lithographic imaging layer 4 is then deposited on top of said patterned first permanent layer 2 and a second pattern having a diameter $ø_3$ (equal to the first pattern) is formed into said second lithographic imaging layer(s) 4, for reducing the first pattern diameter through which the deep via is to be etched.

The deep via is then etched into the substrate 1 by means of Reactive Ion etching using the second pattern with target dimension $ø_3$ as hard mask, for obtaining the final aimed diameter $ø_1$ of the deep via.

A typical undercut is then observed after etching, said undercut 6 is situated under the second lithographic imaging layer(s) 4 but not under the first permanent layer. As soon as said second lithographic imaging layer(s) is/are removed, no undercut remains.

The deep via etch is preferably a passivation polymer type etch. Said etch process is preferably using a fluor comprising plasma, more particularly a $C_4F_8/SF_6$ comprising plasma, and comprises a deposition step followed by an etch step, wherein said deposition/etch steps are continuously repeated.

Said deposition step is preferably performed using a $C_4F_8/SF_6$ comprising plasma having more than 90% $C_4F_8$. More preferred a plasma containing more than 95% $C_4F_8$ is used to perform the deposition step.

The etch step is preferably performed using a $C_4F_8/SF_6$ comprising plasma having more than 90% $SF_6$. More preferred a plasma containing more than 95% $SF_6$ is used to perform the etch step.

Finally the second lithographic imaging layer(s) 4 is/are removed, no undercut is remaining and a deep via with smooth sidewalls is obtained.

The removal of the second lithographic imaging layer(s) 4 is performed by a strip process, said strip process can be performed using a $O_2/N_2$ plasma in a down stream asher followed by a conventional wet clean.

The method according to the second preferred embodiment can be used for the creation of deep vias filled with conductive material 7 such as copper (also referred to as "copper nails") for 3D stacking of interconnect structures (ICs) of semiconductor devices (also referred to as 3D-SIC or 3 dimensional stacked ICs) into the substrate.

Said substrate is then preferably a silicon wafer comprising active devices (referred to as FEOL) with a Pre Metal Dielectric (PMD) layer on top of said substrate acting as the first permanent layer. Said PMD layer is preferably $SiO_2$.

The lithographic pattern used to create first and second target dimensions is preferably smaller than the final aimed diameter of the copper nail and is preferably in the range of 4 µm to create a deep via with final diameter of 5 µm. After trimming the first lithographic pattern the (trimmed) pattern has a diameter of preferably 5 µm.

According to the second preferred embodiment, the problem of hard mask undercut is thus solved and eliminated by using two lithographic patterning steps using one mask set.

Said mask set has a dimension which is smaller than the final aimed diameter of the deep via.

By trimming the first lithographic pattern a wider pattern is obtained.

A second lithographic pattern is then created to be used as hard mask for etching the deep via into the substrate.

After removal of said lithographic pattern no undercut remains and a deep via with smooth sidewalls is created.

In yet the other and also preferred third embodiment of the invention, only one lithographic step is required to pattern the deep via.

The target dimension (opening) of the lithographic mask used in this alternative is smaller than the final aimed diameter of the deep via.

After the lithographic step, the photolithographic pattern in the resist layer is then transferred to the layer underneath said resist layer.

Using the lithographic pattern in the resist as hard mask, the deep via is etched in the substrate.

An undercut underneath the $SiO_2$ is created but removed during subsequent removal steps.

The overhanging part of the resist is removed by trimming the resist to the final aimed diameter of the deep vias. The overhanging $SiO_2$ is then isotropically etched to the final aimed diameter determined by the resist.

Figure 7:
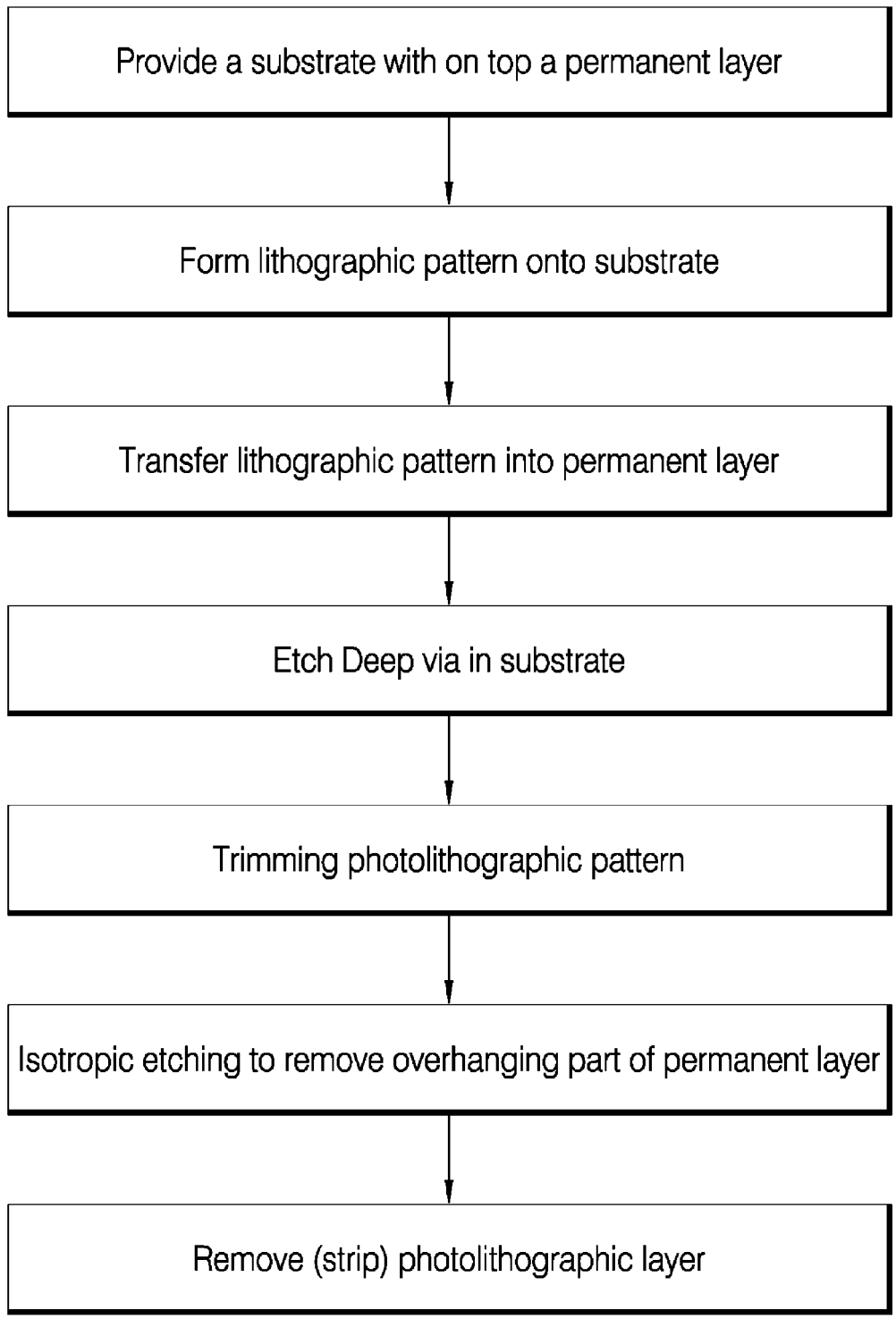
FIG. 7 shows a flow chart illustrating the main processing steps according to the third embodiment.

The method for etching a deep via in a substrate according to the third preferred embodiment is illustrated in FIG. 4 and shown schematically in a flow chart in FIG. 7.

The method for etching a deep via in a substrate according to the third preferred embodiment starts with the step of providing a substrate with a permanent first layer 2 on top of said substrate 1.

Said substrate 1 is preferably a semiconductor substrate, most preferred a Si wafer. e.g. a Si wafer.

On top of said wafer is a permanent layer 2.

For the patterning of deep vias, e.g. for use in three dimensional stacking of wafers for connecting interconnect structures, said permanent layer 2 is preferably a Pre Metal Dielectric (PMD) layer. Most preferred said PMD layer is a $SiO_2$ layer.

Onto said permanent layer 2, at least one lithographic imaging layer(s) (resist) 3 is deposited.

Then a pattern is formed into said first lithographic imaging layer(s) 3 with a target dimension $ø_4$ smaller than the final aimed diameter of the deep via (equal to $ø_1$).

The pattern (having width $ø_4$) is then transferred into said permanent layer 2 (or opening said first layer) and subsequently the deep via is etched in the substrate 1 using the resist pattern 3 as hard mask creating an undercut 6 under the first permanent layer 2.

The deep via etch is preferably a passivation polymer type etch. Said etch process is preferably using a fluor comprising plasma, in particular a $C_4F_8/SF_6$ comprising plasma, with alternating a deposition followed by an etch step wherein said alternating deposition/etch steps are continuously repeated.

Said deposition step is preferably performed using a $C_4F_8/SF_6$ comprising plasma having more than 90% $C_4F_8$, more preferred a plasma containing more than 95% $C_4F_8$ is used to perform the deposition step.

The etch step is preferably performed using a $C_4F_8/SF_6$ comprising plasma having more than 90% $SF_6$, more preferred a plasma containing more than 95% $SF_6$ is used to perform the etch step.

The resist pattern is then trimmed for expanding its diameter up to $\varnothing_1$ (i.e. up to the final aimed diameter of the deep via).

The overhanging part of the permanent layer 2 is then removed by means of isotropical etch (with respect to the trimmed resist pattern) in order to coincide with the final aimed diameter of the deep via. Said isotropical etch can be a dry etch or wet etch (e.g. dip in HF for predetermined time).

Finally the lithographic imaging layer(s) is removed (strip resist).

The method according to the third preferred embodiment can be used for the creation of deep vias for 3D stacking of interconnect structures of semiconductor devices (also referred to as "copper nails") into the substrate.

Said substrate is then preferably a silicon wafer comprising active devices (referred to as FEOL) with a Pre Metal Dielectric (PMD) layer on top of said substrate acting as the first permanent layer.

Said PMD layer is preferably $SiO_2$.

The lithographic pattern used to create the resist pattern is smaller than the final aimed diameter of the copper nail and is preferably in the range of 4 μm to create a deep via with final diameter of 5 μm.

After trimming the resist pattern to the final aimed diameter of the deep via (5 μm), the overhanging part of the $SiO_2$ is removed by isotropic etch for obtaining a final diameter of 5 μm. The resist pattern is then removed (strip).

According to the third preferred embodiment, the problem of hard mask undercut is thus solved and eliminated by means of one lithographic (resist) patterning step using one mask set.

Said mask set has a dimension which is smaller than the final aimed diameter of the deep via.

By trimming the first lithographic pattern to the final diameter of 5 μm it is possible to remove the overhanging part of the layer underneath the resist (PMD layer) to the final diameter of the via.

After removal of said resist pattern no undercut remains and a deep via with smooth sidewalls is created.

In a method according to the first, second or third preferred embodiment, said lithographic imaging layer(s) preferably comprise(s) at least one photoresist layer and optionally at least one anti-reflective coating layer (e.g. BARC).

In a method according to the first, second or third preferred embodiments, said etching process for creation of the deep vias in said substrate is preferably a passivation polymer type etch process.

Said polymer type etch process comprises of at least two fast switching steps that are continuously repeated. Preferably, a fluor comprising plasma is used. More particularly, the first step is a $C_4F_8$ based process that acts as a deposition step which passivates the via bottom and sidewall and enhances the resist selectivity. The second step, using $SF_6$, is the actual etch step.

The method according to the first, second or third preferred embodiments can further comprise, after the step of etching the deep via into the substrate, the steps of depositing a conformal barrier layer onto the sidewalls of said deep via and filling the vias with a conductive material.

Said barrier layer can be e.g. a PVD TaN barrier layer and the conductive material is preferably copper.

If needed a seedlayer can be deposited onto the barrier layer prior to the filling of the deep via with conductive material e.g. when using electrochemical deposition techniques. In other words, when using electrochemical deposition techniques for filling the vias with a conductive material, a method of the preferred embodiments can further comprise the deposition of a seedlayer on the barrier layer.

EXAMPLES

Example 1

Transferring the resist pattern into the Pre Metal Dielectric (PMD) layer used in the process sequence to create deep vias in a silicon substrate for use as copper nails in 3D stacking of interconnect structures.

The Pre Metal Dielectric is a 280 nm $SiO_2$ layer.

The transfer of the resist pattern into said $SiO_2$ layer (also referred to as opening the $SiO_2$ layer) is done in a Lam Research Exelan chamber.

The etch recipe is:
1. Chamber Pressure: 20.4 Pa (153 mTorr)
2. Power 1000 $W_{27}$/2000 $W_2$
3. 335 sccm Ar
4. 18 sccm $O_2$
5. 50 sccm $CF_4$
6. time 28 seconds Example 2

Etching process to create deep vias in a silicon substrate for use as copper nails in 3D stacking of interconnect structures.

The method used for etching the deep vias in a silicon substrate as described in the preferred embodiments is illustrated in this example.

The example gives the etching characteristics used to create deep vias for use as copper nails in 3D stacking of interconnect structures.

These deep vias are created in a Si substrate, said Si substrate is a Si wafer comprising active devices (completed FEOL) with a Pre Metal Dielectric (PMD) layer on top of it. Said PMD layer is a permanent layer which needs to be left intact to protect the already created FEOL.

The Si etch is done in a Lam Research TCP9400DSiE chamber. The process used in the DSiE chamber comprises two fast switching steps that are continuously repeated (up to 800 times). The first step is $C_4F_8$ based and acts as a deposition step which passivates the via bottom and sidewall and enhances the resist selectivity. The second step, using $SF_6$, is the actual etch step. Since this is a fluorine rich plasma and because $SF_x$ polymers do not have sufficient protection properties, it typically gives rise to undercut under the hard mask.

The deposition parameters used during the deposition step are similar to the process described in U.S. Pat. No. 5,501,893 using a plasma with more than 95% $C_4F_8$ The etch parameters during the etch step are similar to the process described in U.S. Pat. No. 5,501,893 using a plasma with more than 95% $SF_6$ By changing the gas flow ratio between $C_4F_8$ and $SF_6$ it is possible to tune the process with respect to slope, etch stop (grass formation), resist selectivity and sidewall roughness. It was found that a ratio of 0.8-1.2 $C_4F_8/SF_6$ was the optimal condition in which polymer deposition at the bottom was such that no etch stop occurred while still enough resist selectivity and sidewall passivation by $C_4F_8$ was obtained as to reach a certain degree of slope.

Example 3

Removal of photolithographic imaging layers (resist strip) used in the process sequence to create deep vias in a silicon substrate for use as copper nails in 3D stacking of interconnect structures.

For etching deep vias (e.g. Cu nails) in a Si substrate, the patterned resist is used as hard mask during the reactive ion etching process to create the deep via. In this example the resist is a 3000 nm deposited I-line resist (with vias with diameter of 5 μm printed).

The resist trip is done with a $O_2/N_2$ plasma in a down stream asher, followed by a conventional SPM/APM wet clean.

Example 4

Trimming of photolithographic imaging layers (resist trim) used in the process sequence to create deep vias in a silicon substrate for use as copper nails in 3D stacking of interconnect structures.

The etch process used to trim the resist is done in a Lam Research Versys chamber.

The recipe used to trim resist is as follows:
Chamber pressure: 2.7 Pa (20 mTorr)
Power 1000 W (top)
190 sccm $O_2$ Pressure and power might be changed and $Cl_2$ and HBr might be added to the gas mixture to tune and optimize the recipe.

Example 5

Experimental Results and Proof of Concept

Figure 8:
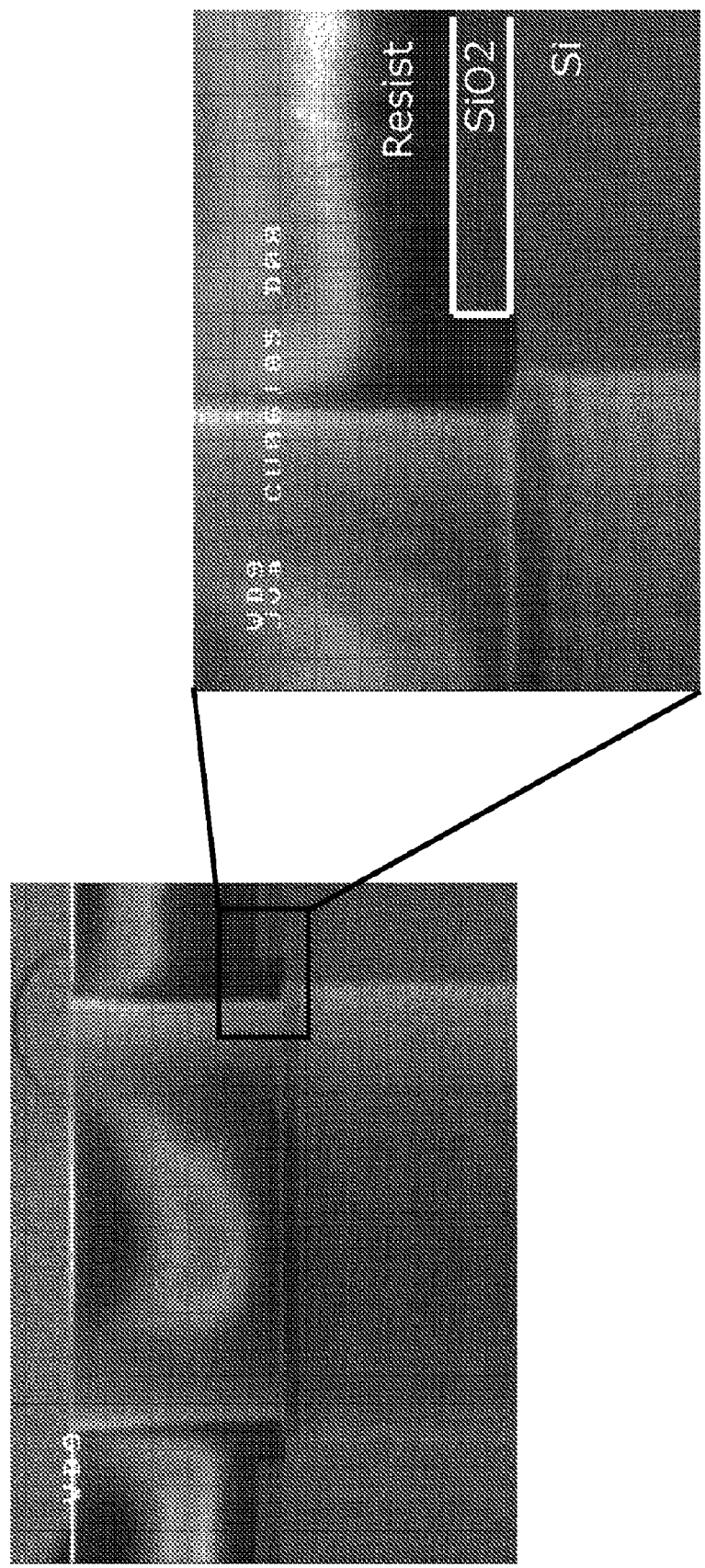
FIG. 8 illustrates the results using the method of the first preferred embodiment to etch deep via with aspect ratio (AR) 5 using the double patterning approach.

FIG. 8 illustrates the results obtained when using the first preferred method of the invention to etch deep via with aspect ratio (AR) of 5 or in other words deep vias with a target depth of 50 μm and a target width of 10 μm using the double patterning approach.

Figure 9:
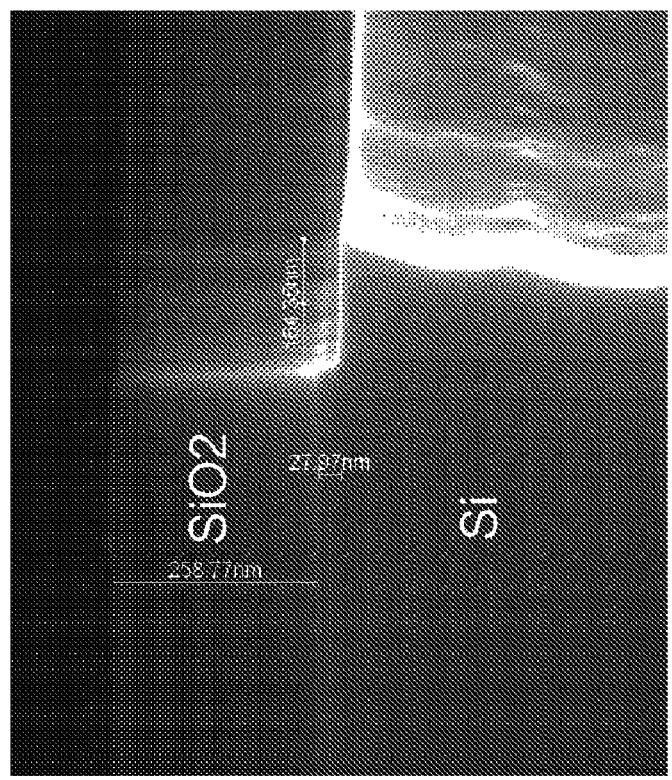
FIG. 9 illustrates the results using the method of the first preferred embodiment to etch deep via with aspect ratio (AR) 10 using the double patterning approach.
Figure 9:
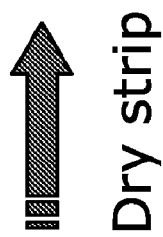
Figure 9:
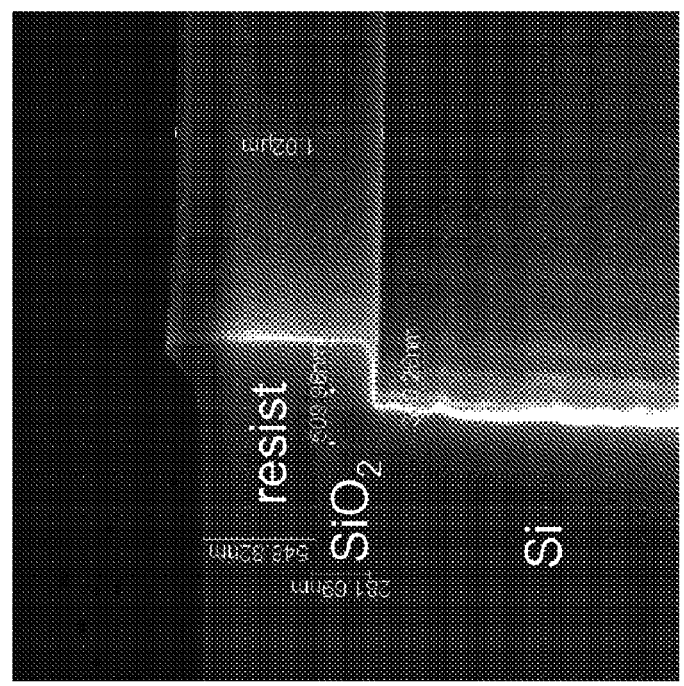

FIG. 9 illustrates the results obtained when using the first preferred method of the invention to etch deep via with aspect ratio (AR) of 10 or in other words deep vias with a target depth of 50 μm and a target width of 5 μm using the double patterning approach.

In both cases the $SiO_2$ hardmask layer (PMD layer) has a thickness of around 250-300 nm and the resist layer used to create the (smaller) second pattern has a thickness of around 2.5 μm which is consumed partly during etching the deep via towards approximately 0.5 μm.

On the left side of FIG. 8 and FIG. 9 the results is shown before resist strip.

All references cited herein are incorporated herein by reference in their entirety. To the extent publications and patents or patent applications incorporated by reference contradict the disclosure contained in the specification, the specification is intended to supersede and/or take precedence over any such contradictory material.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for etching a deep via in a substrate comprising the steps of:
   providing a substrate with at least one first layer on top of the substrate;
   depositing at least one first lithographic imaging layer on top of the first layer;
   forming a first pattern having a first diameter into the first lithographic imaging layer, wherein the first diameter is equal to a final aimed diameter of a deep via;
   transferring the first pattern into the first layer, whereby a patterned first layer having the first pattern is obtained;
   removing the first lithographic imaging layer;
   depositing at least one uniform polymer layer deposited on top of the patterned first layer, whereby the diameter of the first pattern is reduced to a second diameter smaller than the first diameter;
   etching the deep via in the substrate using the first pattern with the uniform polymer layer on top as a hard mask; and
   removing the first lithographic imaging layer and the uniform polymer layer.

2. The method according to claim 1, wherein the first layer is a protective layer.

3. The method according to claim 1, wherein the first layer is a sacrificial layer.

4. The method according to claim 1, wherein the deep via has a height to width ratio higher than about 5:1.

5. The method according to claim 1, wherein the deep via has a width of from 1 μm to 10 μm and a depth into the substrate of from 10 μm to 100 μm.

6. The method according to claim 1, wherein the deep via has a width of 5 μm and a depth of 50 μm.

7. The method according to claim 1, for use in a method of fabricating high aspect ratio vias for stacking semiconductor wafers in the three dimensional stacking of interconnect structures or stacking elements of devices in MEMS applications.

8. The method according to claim 1, wherein the first pattern and the second pattern have a difference of more than about 10% and less than about 20% in diameter.

9. The method according to claim 1, wherein the lithographic imaging layer is a resist layer with an anti-reflective coating.

10. The method according to claim 1, wherein the step of removing the lithographic imaging layer comprises using an $O_2/N_2$ comprising plasma followed by a wet clean.

11. The method according to claim 1, wherein the first layer on top of the substrate is a permanent first layer.

12. The method according to claim 11, wherein the permanent first layer is a Pre Metal Dielectric layer.

13. The method according to claim 11, wherein the permanent first layer on top of the substrate is a $SiO_2$ layer.

14. The method according to claim 1, wherein the etching of the deep via in the substrate is performed in a passivation polymer type etch process using a fluor comprising plasma.

15. The method according to claim 14, wherein the passivation polymer type etch process uses a $C_4F_8/SF_6$ comprising plasma and comprises alternating a deposition step followed by an etch step, wherein the alternating deposition and etch steps are repeated.

16. The method according to claim 15, wherein the deposition step is performed using a $C_4F_8/SF_6$ comprising plasma having more than 95% $C_4F_8$.

17. The method according to claim 15, wherein the etch step is performed using a $C_4F_8/SF_6$ comprising plasma having more than 95% $SF_6$.

18. A method for etching a deep via in a substrate comprising the steps of:
providing a substrate with at least one first layer on top of the substrate;
depositing at least one first lithographic imaging layer on top of the first layer;
forming a first pattern having a first diameter into the first lithographic imaging layer;
expanding the first pattern in the first lithographic imaging layer by resist trimming, whereby a trimmed pattern is created;
transferring the trimmed pattern into the first layer, whereby a patterned first layer having the first pattern is obtained;
removing the first lithographic imaging layer;
depositing at least one second lithographic imaging layer on top of the patterned first layer;
forming, into the second lithographic imaging layer and coinciding with the first pattern, a second pattern having a second diameter, wherein the first diameter and the second diameter are equal to each other and smaller than a final aimed diameter of a deep via;
etching the deep via in the substrate using the patterned second layer as a hard mask; and
removing the second lithographic imaging layer.

19. The method according to claim 18, wherein the resist trimming is performed in an $O_2$ comprising plasma further comprising at least one of $Cl_2$ and HBr.

20. The method according to claim 18, for use in a method of fabricating high aspect ratio vias for stacking semiconductor wafers in the three dimensional stacking of interconnect structures or stacking elements of devices in MEMS applications.

21. The method according to claim 18, wherein the deep via has a width of from 1 µm to 10 µm and a depth into the substrate of from 10 µm to 100 µm.

22. The method according to claim 18, wherein the step of removing the lithographic imaging layer comprises using an $O_2/N_2$ comprising plasma followed by a wet clean.

23. The method according to claim 18, wherein the etching of the deep via in the substrate is performed in a passivation polymer type etch process using a fluor comprising plasma.

24. A method for etching a deep via in a silicon substrate comprising the steps of:
providing a silicon substrate with at least one first layer on top of the silicon substrate;
depositing at least one first lithographic imaging layer on top of the first layer;
forming a first pattern having a first diameter into the first lithographic imaging layer;
transferring the first pattern into the first layer, whereby a patterned first layer having the first pattern is obtained;
removing the first lithographic imaging layer;
depositing at least one second lithographic imaging layer on top of the patterned first layer;
forming, into the second lithographic imaging layer and coinciding with the first pattern, a second pattern having a second diameter;
etching a deep via in the silicon substrate using the patterned second layer as a hard mask; and
removing the second lithographic imaging layer.

25. The method according to claim 24, for use in a method of fabricating high aspect ratio vias for stacking semiconductor wafers in the three dimensional stacking of interconnect structures or stacking elements of devices in MEMS applications.

26. A method for etching a deep via in a silicon substrate, comprising the steps of:
providing a silicon substrate with at least one first layer on top of the silicon substrate;
depositing at least one lithographic imaging layer resist on top of the first layer;
forming a resist pattern in the lithographic imaging layer resist with a target dimension smaller than a final aimed diameter of the deep via;
transferring the resist pattern into the first layer;
etching a deep via in the silicon substrate using the lithographic imaging layer resist as a hard mask, whereby an undercut is created under the first layer;
trimming the resist pattern to the final aimed diameter of the deep via,
isotropically removing an overhanging part of the first layer; to the final aimed diameter of the deep via; and
removing the lithographic imaging layer resist.

27. The method according to claim 26, wherein the first layer is a protective layer.

28. The method according to claim 26, wherein the first layer is a sacrificial layer.

29. The method according to claim 26, wherein the deep via has a height to width ratio higher than about 5:1.

30. The method according to claim 26, wherein the deep via has a width of from 1 µm to 10 µm and a depth into the substrate of from 10 µm to 100 µm.

31. The method according to claim 26, wherein the deep via has a width of 5 µm and a depth of 50 µm.

32. The method according to claim 26, for use in a method of fabricating high aspect ratio vias to be used for stacking semiconductor wafers, in the three dimensional stacking of interconnect structures or stacking elements of devices in MEMS applications.

33. The method according to claim 26, wherein the resist pattern has a difference of more than about 10% and less than about 20% in diameter compared to the final aimed diameter of the deep via.

34. The method according to claim 26, wherein the lithographic imaging layer resist comprises an anti-reflective coating.

35. The method according to claim 26, wherein the resist trimming is performed in an $O_2$ comprising plasma further comprising at least one of $Cl_2$ and HBr.

36. The method according to claim 26, wherein the step of removing the lithographic imaging layer resist comprises using a $O_2/N_2$ comprising plasma followed by a wet clean.

37. The method according to claim 26, wherein the first layer on top of the substrate is a permanent first layer.

38. The method according to claim 37, wherein the permanent first layer is a Pre Metal Dielectric layer.

39. The method according to claim 37, wherein the permanent first layer on top of the substrate is a $SiO_2$ layer.

40. The method according to claim 26, wherein the etching of the deep via in the substrate is performed in a passivation polymer type etch process using a fluor comprising plasma.

41. A method according to claim 40, wherein the passivation polymer type etch process uses a $C_4F_8/SF_6$ comprising plasma and comprises alternating a deposition followed by an etch step, wherein the alternating deposition and etch steps are repeated.

42. A method according to claim 41, wherein the deposition step is performed using a $C_4F_8/SF_6$ comprising plasma having more than 95% $C_4F_8$.

43. A method according to claim 41, wherein the etch step is performed using a $C_4F_8/SF_6$ comprising plasma having more than 95% $SF_6$.

* * * * *